United States Patent [19]
Blauschild

[11] 3,940,683
[45] Feb. 24, 1976

[54] ACTIVE BREAKDOWN CIRCUIT FOR INCREASING THE OPERATING RANGE OF CIRCUIT ELEMENTS

[75] Inventor: Robert A. Blauschild, Sunnyvale, Calif.

[73] Assignee: Signetics Corporation, Sunnyvale, Calif.

[22] Filed: Aug. 12, 1974

[21] Appl. No.: 496,554

[52] U.S. Cl. .................. 323/4; 307/296; 323/16; 323/22 T; 330/22; 330/40
[51] Int. Cl.² ......................................... H03F 3/10
[58] Field of Search ............ 307/296, 297; 323/1, 4, 323/16, 19, 22 T; 330/17, 18, 22, 38 M, 39, 40

[56] References Cited
UNITED STATES PATENTS

| | | | |
|---|---|---|---|
| 3,566,293 | 2/1971 | Recklinghausen | 330/22 X |
| 3,648,153 | 3/1972 | Graf | 323/1 |
| 3,660,694 | 5/1972 | Lucas | 330/22 X |
| 3,835,410 | 9/1974 | Wittlinger | 330/22 X |
| 3,855,541 | 12/1974 | Leidich | 330/22 |

*Primary Examiner*—A. D. Pellinen
*Attorney, Agent, or Firm*—Flehr, Hohbach, Test, Albritton & Herbert

[57] ABSTRACT

An active circuit and method for increasing the operating range of circuit elements of the type connected between a power supply and a circuit element, the active circuit including a transistor having a base, emitter and a collector, the transistor having a breakdown voltage. The transistor is biased to provide a current path through it to the circuit element and to develop a voltage thereacross. The transistor and its biasing in combination are operative when the supply voltage exceeds a predetermined level to cause the transistor to breakdown. The breakdown voltage across the transistor opposes the supply voltage so that the operating range is increased and the actual voltage applied to the element does not exceed the breakdown voltage of the element.

5 Claims, 12 Drawing Figures

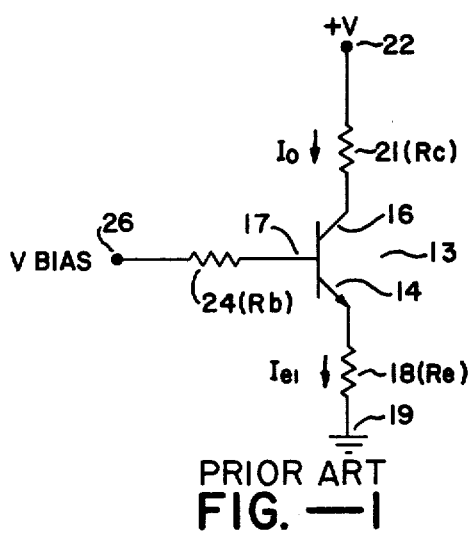
PRIOR ART
FIG.—1
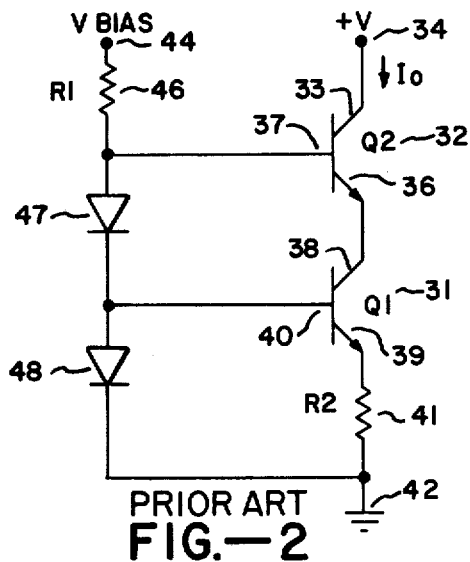
PRIOR ART
FIG.—2
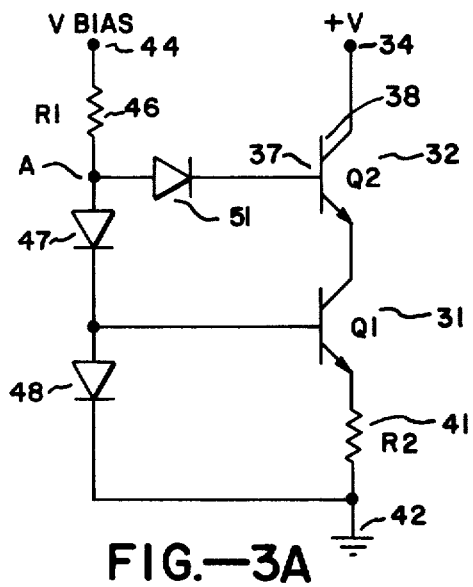
FIG.—3A
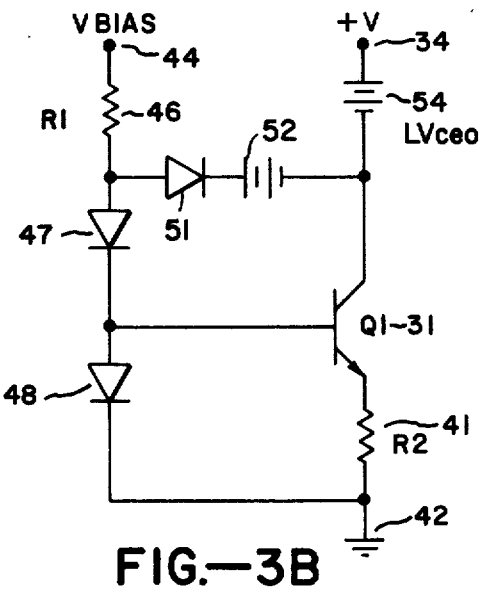
FIG.—3B
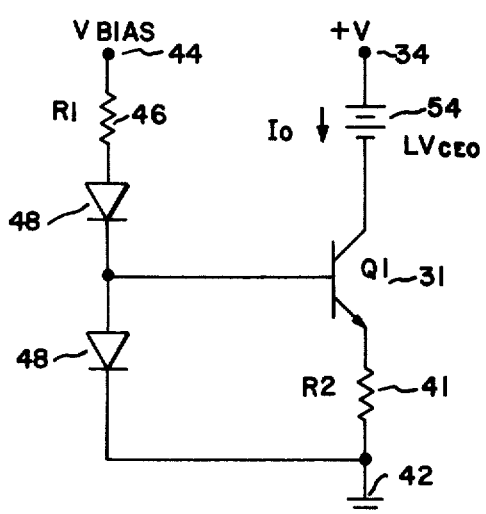
FIG.—3C
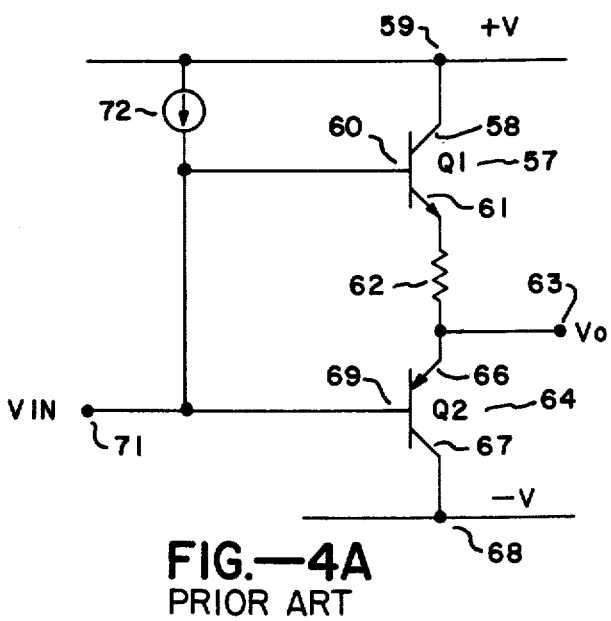
FIG.—4A
PRIOR ART

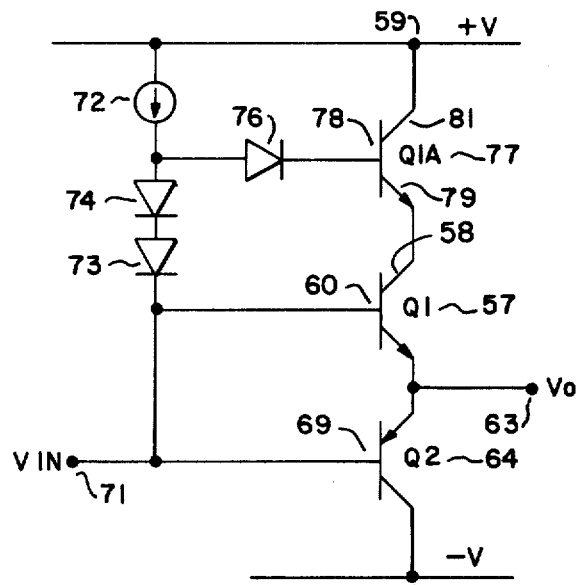
FIG.—4B
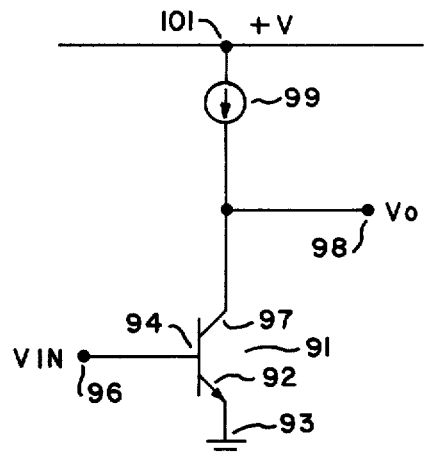
PRIOR ART
FIG.—5A
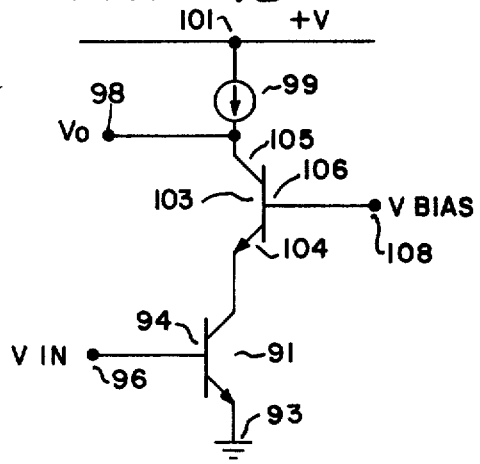
PRIOR ART
FIG.—5B
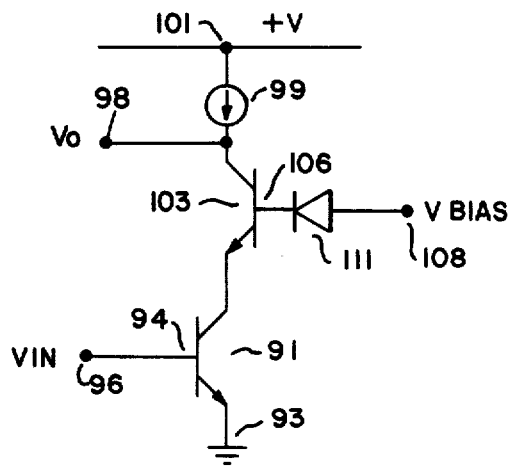
FIG.—5C
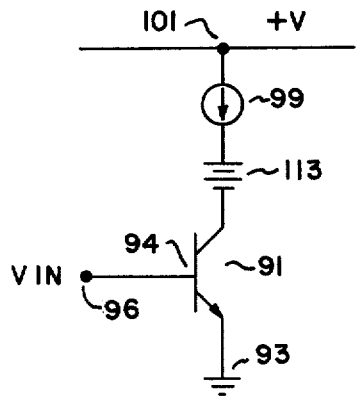
FIG.—5D
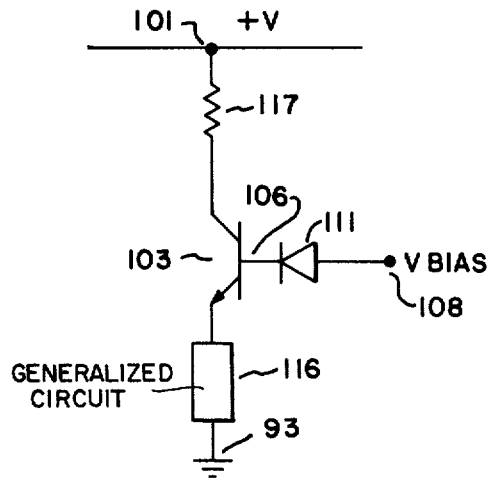
FIG.—5E 3,940,683

ACTIVE BREAKDOWN CIRCUIT FOR INCREASING THE OPERATING RANGE OF CIRCUIT ELEMENTS

BACKGROUND OF THE INVENTION

This invention relates generally to a circuit for increasing the operating range of circuit elements and a method of operation whereby high breakdown capabilities may be obtained using circuit elements having low breakdown characteristics. More particularly, this invention relates to a circuit and method of operation for increasing the operating range of circuit elements, such as semiconductor elements, so that high breakdown capabilities may be obtained using semiconductor elements having low breakdown characteristics.

Although high breakdown circuit elements, such as transistors, have heretofore been provided, they occupy excessive semiconductor areas because of the large depletion regions required to support higher operating voltages. For example, linear elements must handle a wide signal range and may operate with 36 to 45 volts, or higher, voltage swings. The relatively high supply voltages required for operation dictate that all, or substantial portions, of the semiconductor structures be large in size to provide large depletion regions to support the high operational voltages utilized. In contrast, digital elements may typically operate from a 5 volt supply, high operational voltage swings are not encountered, and the structure need not provide large depletion regions. Accordingly, linear element structures may have to be 4 or more times the physical size of digital element structures so that selected linear elements have the requisite large depletion regions for high breakdown operational characteristics.

Thus there is a need for a circuit for increasing the operating range of circuit elements whereby high breakdown capabilities may be obtained using circuit elements having low breakdown characteristics.

SUMMARY OF THE INVENTION AND OBJECTS

Accordingly, it is a general object of the present invention to provide a circuit for increasing the operating range of circuit elements whereby high breakdown capabilities may be obtained using circuit elements having low breakdown characteristics.

It is a particular object of the present invention to provide a circuit and method of operation for increasing the operating range of circuit elements, such as semiconductor elements, so that high breakdown capabilities may be obtained using elements having low breakdown characteristics.

The foregoing and other objects of the invention are achieved in an active circuit and method for increasing the operating range of circuit elements of the type connected between a power supply and a circuit element, the active circuit including a transistor having a base, emitter and a collector, said transistor having a breakdown voltage. Means biases said transistor for providing a current path through said transistor to supply current to said circuit element and to develop a voltage thereacross. Said means and said transistor in combination are operative when said supply voltage exceeds a predetermined level to cause said transistor to breakdown. Said breakdown voltage across said transistor opposes the supply voltage so that the operating range in increased and the actual voltage applied to the element does not exceed the breakdown voltage of the element.

Brief Description of the Drawings

FIG. 1 is a schematic diagram of a prior art active breakdown circuit including a transistor.

FIG. 2 is a schematic diagram of a prior art current source including plural transistors and a diode bias string.

FIG. 3A is a schematic diagram of a breakdown current source including plural transistors, an isolating diode, and a diode bias string.

FIG. 3B is a schematic diagram equivalent circuit of FIG. 3A with a battery substituted for the breakdown transistor.

FIG. 3C is a schematic diagram equivalent circuit of FIG. 3B when the isolating diode is reverse biased.

FIG. 4A is a schematic diagram of a prior art output stage.

FIG. 4B is a schematic diagram of an output stage including an additional biasing diode.

FIG. 5A is a prior art amplifier gain stage.

FIG. 5B is a prior art cascode circuit.

FIG. 5C is a modification of FIG. 5B embodying the present invention.

FIG. 5D is an equivalent circuit of FIG. 5C.

FIG. 5E is a generalization of FIG. 5C.

DESCRIPTION OF THE PREFERRED EMBODIMENTS

A plurality of active circuits for increasing the operating range of circuit elements are shown in the accompanying Figures. Briefly, in general overview, the circuits utilize a transistor breakdown mechanism which becomes operative when the voltage across the circuit element exceeds a predetermined level. The transistor breakdown voltage opposes a portion of the applied operational voltage and thereby increases the operating range of low voltage circuit elements. Specifically, the breakdown circuit permits semiconductor device operation at increased voltages which, for example, may be greater than twice the $LV_{ceo}$ voltage of individual devices. The $LV_{ceo}$ breakdown voltage, that is, the collector to emitter breakdown voltage with an open base circuit, may typically be 15 volts for thin (3–4 micron) epitaxial layer, digital structures. It is desirable, in order to minimize size and geometry, to operate such devices at the higher voltages encountered in analog applications. Such applications require structures having an $LV_{ceo}$ breakdown of typically 40 volts necessitating a thick epitaxial layer structure (12–20 microns) to provide the depletion regions to support this higher voltage. As will be seen, the present invention provides a circuit for increasing the operating range of circuit elements so that a high breakdown capability, such as 40 volts, may be obtained using low breakdown (e.g. 15 volt) thin epitaxial layer structures.

Referring to FIG. 1, a general prior art circuit including a transistor capable of avalanche breakdown is shown. Transistor 13 has an emitter 14, a collector 16, and a base 17 and may be of either NPN or PNP conductivity type. For purposes of discussion the circuit includes an emitter resistor 18 ($R_e$), connected between emitter 14 and a common or ground terminal 19. A collector resistor 21 ($R_c$) is connected between collector 16 and a positive terminal 22 of a power supply, the negative terminal of the power supply being connected to the common or ground terminal 19. A base resistor 24 ($R_b$) is connected between base 17 and a first terminal 26 of a power supply providing a voltage $V_{bias}$, and having a negative terminal connected to the common or ground terminal 19.

In operation, the transistor 13 has a voltage V applied to terminal 22 and an additional voltage $V_{bias}$ applied to terminal 26 having a magnitude less than V and of suitable polarity to forward bias the base-emitter junction and further reverse bias the base-collector junction. As voltage V is increased in magnitude, alpha ($\alpha_1$), that is, the common base current gain of the transistor, increases. This gain may be expressed as:

$$\alpha 1 \simeq \frac{\alpha_{1o}}{1 - (\frac{V}{BV_{plane}})m}$$

where $m$ is approximately equal to 4 for an NPN transistor, and $BV_{plane}$ is the avalanche breakdown voltage for a plane PN junction.

From the expression it will be noted that as $\alpha_1$ approaches the number 1, $I_0$ in FIG. 1 more nearly equals $I_{e1}$, the emitter current. When $\alpha_1$ exceeds the number 1, then beta, the common emitter current gain which is equal to $\alpha/1 - \alpha$ becomes negative. At this point base current reverses and flows out of the base 17 of transistor 13 and thereby increases current $I_0$ which is the only current path flowing into the transistor 13. The current flowing out of the base 17 of transistor 13 flows through resistor 24 ($R_b$) increasing the forward bias on transistor 13 and further increasing current $I_0$. This multiplication effect or multiplication factor is a function of the voltage V, avalanche breakdown occuring to provide a voltage between transistor collector 16 and emitter 14 with current limited only by the series resistor in the circuit. Resistance 21 ($R_c$) limits the maximum current flowing into collector 16. Further resistance 18 ($R_e$) provides feedback in that it reduces the effect of $V_{bias}$ appearing between base 17 and emitter 14 and thereby decreases $I_0$. Thus it is to be noted that at the onset of the negative beta region, the region of rapidly increasing $I_0$, $I_0$ is proportional to the magnitude of $R_b$ and inversely proportional to $R_e$. In general the external circuit thus determines to a great extent the transistor breakdown voltage.

It has been found in the prior art that the $LV_{ceo}$ breakdown voltage may be maximized by using a very high resistance for the emitter resistance $R_e$, such as a current source, and a very low resistance for the base resistance $R_b$, such as a series diode bias string, as shown in FIG. 2. The circuit of FIG. 2 includes series connected NPN transistors 31 and 32, the collector 33 of transistor 32 is connected to a voltage terminal 34, the emitter 36 of transistor 32 is connected to the collector 38 of transistor 31 and the emitter 39 of transistor 31 is connected via an emitter resistor 41 to a common or ground terminal 42. The circuit further includes a biasing network connected to a terminal 44 of a $V_{bias}$ supply. A resistor 46 is connected between terminal 44 and the base terminal 37 of transistor 32. A forward biased diode 47 is connected between base 37 of transistor 32 and base 40 of transistor 31. An additional forward biased diode 48 is connected between base 40 of transistor 31 and the common or ground terminal 42.

Transistor 31, in combination with the biasing network, attempts to provide the high impedance current source desirable to maximize the effective emitter resistance of transistor 32 and thus increase the breakdown voltage of transistor 32 in accord with the expression previously discussed. Further, the effective base resistance $R_b$ of transistor 32 is approximately equivalent to the resistance of diode 47 and 48 connected in a forward biased manner between base 37 and ground. Thus the diode string attempts to minimize the resistance $R_b$ and thereby further increase the breakdown voltage of transistor 32.

When the appropriate voltages are applied for operation of the FIG. 2 circuit, the current source including transistor 31 is clamped approximately one diode drop, as a result of diode 48, above the common or ground potential 42. Thus, the avalanche breakdown of the combination of transistors 31, 32, and associated circuitry occurs at the onset of negative beta. This condition occurs when base current at base 37 reverses and flows out of base 37 and transistor 32 assumes an avalanche breakdown state. It has been found that the breakdown voltage of the single device previously discussed in conjunction with FIG. 1 may approximate 23 volts and with the configuration of FIG. 2 the breakdown voltage increases to approximately 30 volts for given semiconductor structures. At the onset of negative beta, the corresponding negative beta current produces a current in transistor 31 which will in turn increase the current in transistor 32, thereby increasing the transistor 32 emitter current and further increasing the collector current of transistor 32. Thus the collector current of transistor 32 is increased first by the negative beta and then by the feedback mechanism. Thus a large increase in the collector current of transistor 32 is produced in response to the onset of breakdown. The circuit of FIG. 2 provides an improvement in breakdown because of the large equivalent emitter resistance ($R_e$) and the small equivalent base resistance ($R_b$) over that of the single device configuration of FIG. 1. However higher device operation, above the 30 volts thereby obtained, is required.

Referring to FIG. 3A, an improved circuit for increasing the operating range is shown. In FIG. 3A, a diode 51 has been interposed between base 37 of transistor 32 and the intersection of resistor 46 and diode 47. The polarity of the diode 51 is such that it provides a low impedance path for current flowing from the intersection of resistor 46 and 47 into base 37 of transistor 32. On the other hand however, diode 51 presents a high impedance to current which may flow out of base 37 of transistor 32 in attempt to flow to the intersection of resistor 46 and diode 47.

Turning to the operation of the FIG. 3A circuit, as voltage V increases, the common base current gain $\alpha$ of transistor 32 increases until $\alpha$ reaches a current gain of 1 and the base current then attempts to reverse and flow out of base 37. At this point the diode 51 prevents the flow of current out of the base 37 and the circuit changes modes, the base 37 being effectively at a high impedance relative to current flow out of said base and transistor 32 goes into avalanche breakdown. The voltage appearing across transistor is the voltage at which avalanche occurs with an open circuit base or essentially $LV_{ceo}$ as it is defined for a particular device.

It might first appear that transistor 31 in FIG. 3A would be saturated, that is, that the collector-to-base voltage is forward biased and the junction is forward biased since the collector 38 is two diode drops below node A and base 40 is only one diode drop below node A. However, it has been found that the collector base junction is not biased in the active region. The current density through diode 51 includes only the base current of the transistor, hence the voltage across diode 51 is less than 0.6v the typical forward diode voltage. Therefore the difference in voltage between the typical 0.6v and the lesser voltage actually developed across diode 51 appears as a base-collector bias for transistor 31.

Referring to FIG. 3B, the equivalent circuit of the breakdown operational mode is shown, wherein a battery 52 having a potential of approximately 0.6 volts is substituted as a equivalent for the forward biased, base-emitter junction of transistor 32 and an additional battery 54 is shown being equivalent to the avalanche breakdown voltage across transistor 32 that is, $LV_{ceo}$. It is thus noted that diode 51 is reverse biased and transistor 31 continues to provide the same current. The collector-base voltage of transistor 31 thus is approximately equal to $V-0.6-LV_{ceo}$. Therefore the operating range of transistor 32 has been increased by the magnitude of $LV_{ceo}$.

Referring to FIG. 3C, the equivalent circuit when the diode 51 is reversed biased is shown. When diode 51 is reversed biased, it presents a high impedance which effectively removes diode 51 and battery 52 from the equivalent circuit. Thus it is apparent that by intentional breakdown, that is causing an avalanche breakdown of a transistor such as transistor 32, when the device beta becomes negative, a constant current $I_0$ results in transistor 32. The current $I_0$ changes only as a function of the base current of transistor 31 which correspondingly brings about a change in the series path, collector current of transistor 31. It is further apparent that a transistor such as 32 having a given avalanche breakdown characteristic may be easily added with a minimum of additional circuitry to more than double the useful range of the current source circuit. In fact, it has been found that the useful operating range by utilizing diode 51 with the devices having individual $LV_{ceo}$ ranges of 15–18 volts produces a 40 volt operating range utilizing the simple interconnection as shown in FIGS. 3A–C.

Referring to FIGS. 4A and 4B, the invention is shown in FIG. 4B utilized in combination with a complimentary output stage. Prior art FIG. 4A shows a NPN transistor 57 having a collector 58 connected to a positive voltage supply 59. The emitter 61 of transistor 57 is connected via resistor 62 to output terminal 63. A PNP transistor 64 has an emitter 66 connected to output terminal 63 and a collector 67 connected to a negative voltage supply terminal 68. The base 69 of transistor 64 is connected to a $V_{in}$ input voltage terminal 71, and is connected to base 60 of transistor 57 and is further connected to base current source 72. The remaining terminal of base current 72 is connected to the positive terminal 59. Base current source 72 may be of any conventional type and may include a large series resistor.

Referring to FIG. 4B, the circuit of 4A is shown having diode string 73 and 74 interposed between current source 72 and the base 69 of transistor 64. Further an isolating diode 76 is interposed between the junction of diode 74 and source 72 and is connected to the base 78 of an additional transistor 77. Transistor 77 has an emitter 79 connected to collector 58 of transistor 57 and a collector 81 connected to positive voltage terminal 59.

In operation, as the $V_o$ output voltage decreases the transistor 77 collector-base voltage increases until the common base current gain of transistor 77 becomes greater than 1. At this time, as previously discussed, transistor 77 breaks down, that is, goes into an avalanche breakdown mode and the transistor acts like a battery in series with the collector of transistor 57. Further as was previously discussed an isolating diode 76 functions to present a high impedance to current which flows out of base 76 at the onset of avalanche breakdown. Diode 76 may be of collectorbase type of diode structure to provide a higher breakdown. It is to be noted that an additional diode 74 has been provided in the diode bias string over the bias string shown in FIG. 3A. The FIG. 3A circuit biasing required only one diode 47 between diode 51 and the base of transistor 31 for the relatively low current density and corresponding voltage drop in diode 51 and transistor 32. However, in the FIG. 4B circuit, configured as an output stage, transistor 77 has a relatively high current density and thus an additional diode 74 is required for biasing. Of course, it is understood that a Schottky diode having a smaller voltage drop may be substituted for diode 76 or a resistor or V base-to-emitter voltage multiplier may likewise be substituted for the diode string including diodes 73 and 74.

In operation, as the voltage between terminal 59 and the output terminal $V_0$ exceeds a predetermined magnitude, the transistor 77 assumes an avalanche breakdown condition, diode 76 is reverse biased and accordingly the voltage across transistor 77 is that of the $LV_{ceo}$ magnitude.

Referring to FIGS. 5A–E, the invention is shown in combination with a amplifier gain stage. FIG. 5A shows a conventional gain transistor 91 having an emitter 92 connected to a common or ground terminal 93, a base 94 connected to a $V_{in}$ terminal 96, and a collector 97 connected to a $V_0$ output terminal 98. A constant current source 99 is connected between 97 and voltage supply 101. Referring to FIG. 5B, an additional transistor 103 is shown interposed between the collector of transistor 91 and current source 99 wherein the emitter 104 is connected to transistor 91 and the collector 105 is connected to source 99. The base 106 of transistor 103 is connected to $V_{bias}$ terminal 108. The FIG. 5B cascode arrangement provides a much higher output resistance but the negative beta problem previously discussed still exists. Moreover the output resistance is relatively low in the negative beta region.

Referring to FIG. 5C an additional diode 111 has been interposed in the circuit of FIG. 5B and functions as has been previously discussed. Once the negative beta region is encountered, current out of the base is presented with a relatively high impedance path through diode 111. Thus base current does not flow out of transistor 103. Transistor 103 then goes into avalanche breakdown and the voltage thereacross becomes that of the transistor's $LV_{ceo}$ magnitude, the base 106 approximating an open base circuit to reverse current flow out of base 106. The equivalent of FIG. 5C circuit is shown in FIG. 5D wherein an equivalent battery 113 is shown substituted for the avalanche breakdown device 103. In both FIGS. 5B and 5C the voltage $V_{bias}$ can be shown as a battery of sufficient and suitable magnitude or specifically may be a voltage reference such as plural diodes connected in a diode bias string to ground.

Referring to FIG. 5E, a generalization of the circuit for increasing the operating range of circuit elements is shown wherein the transistor 103 is shown interconnected with a generalized two terminal circuit element 116 which has been substituted for the previously described transistor 91 of FIG. 5C. Further, a generalized impedance, such as a resistance 117 has been substituted for current source 99. Thus it is to be seen that transistor 103 may function as previously dicussed to assume a breakdown condition and thus have a voltage thereacross approximately equal to the $LV_{ceo}$ of the device, with diode 111 preventing the current flow out of the base 106 of device 103 at the onset of breakdown. It may be further seen that the circuit may thus generally be applied to increase the operating range of two terminal devices or circuit elements in addition to the three terminal active semiconductor devices previously discussed.

Although respective NPN and PNP devices have been shown it is of course understood that the opposite conductivity devices may be substituted therefore by reversing the interconnections and transposing voltage polarities as is well known to those skilled in the art.

Thus it is apparent that there has been provided a circuit for increasing the operating range of circuit elements whereby high breakdown capabilities may be obtained using circuit elements having low breakdown characteristics. More particularly, a circuit and method of operation for increasing the operating range of circuit elements, such as increasing the operating range of low voltage digital semiconductor elements, so that the elements have high breakdown capabilities and thus may be utilized in increased voltage, analog circuit applications.

I claim:

1. In an active circuit for increasing the operating range of semiconductor circuit elements the active circuit being of the type connected between a power supply and a circuit element and including a transistor having a base, emitter and a collector, said transistor having a breakdown voltage, means biasing said transistor for providing a current path through said transistor to supply current to said circuit element and to develop a voltage thereacross and including means for biasing said transistor base and emitter as a forward biased junction for base current flow in a first direction and for biasing said base and collector of said transistor as a reverse biased junction and including unidirectional means for providing a low impedance to base current flow in said first direction, and a high impedance to base current flow in the opposite direction, said supply voltage exceeding a predetermined level to cause said transistor to breakdown, said breakdown voltage across said transistor opposing the supply voltage so that the operating range is increased and the actual voltage applied to the element does not exceed the breakdown voltage of the element said unidirectional means impeding base current flow in said opposite direction to prevent feedback of such current flow whereby said transistor breakdown occurs substantially at the open-base, collector to emitter rating of said transistor.

2. A circuit in claim 1 wherein said unidirectional means includes a semiconductor diode.

3. A circuit as in claim 2 wherein said circuit element is a transistor.

4. In a circuit for increasing the operating range of a semiconductor device configured as a current source, and connected to a power supply having first and second terminals, the circuit including first and second transistors, each having a base, an emitter and a collector and respective breakdown voltages, the collector of the first connected to the first power supply terminal and the emitter of the first connected to the collector of the second, a resistor connected between the emitter of the second transistor and the second terminal of the power supply, an isolating diode connected to the base of the first transistor for preventing base current flow away from said transistor, biasing means connected to the base of the second transistor and to the second terminal of said supply for forward biasing said second transistor as a current source, said biasing means having also being connected to the remaining terminal of said diode for biasing said first transistor to provide a current path through said transistor for said second transistor, said power supply voltage exceeding a predetermined level to cause said first transistor to breakdown said diode preventing base current flow from said first transistor while in breakdown to prevent feedback of such current flow whereby said transistor breakdown occurs at substantially the open-base, collector-to-emitter breakdown voltage of said transistor, such breakdown voltage opposing the supply voltage so that the voltage applied to said second transistor does not exceed the breakdown voltage of said second transistor.

5. In a method for increasing the operating range of circuit elements utilizing an active circuit connected between a power supply and said elements of the type including a transistor having a base and having a breakdown voltage, the method comprising biasing said transistor including providing forward biased base current flow in a first direction to supply current to said circuit element and to develop a voltage thereacross, causing said transistor to breakdown when said supply voltage exceeds a predetermined level said breakdown voltage opposing the supply voltage so that the operating range is increased, and prior to causing said transistor to breakdown isolating said transistor base to current flow in an opposite direction to prevent feedback of such current flow whereby said transistor breakdown occurs substantially at the open-base, collector to emitter rating of said transistor.

* * * * *